(12) United States Patent
Toyoda et al.

(10) Patent No.: US 10,580,907 B2
(45) Date of Patent: Mar. 3, 2020

(54) SEMICONDUCTOR DEVICE AND SEMICONDUCTOR MODULE

(71) Applicant: FUJI ELECTRIC CO., LTD., Kawasaki-shi, Kanagawa (JP)

(72) Inventors: Yoshiaki Toyoda, Matsumoto (JP); Hideaki Katakura, Matsumoto (JP)

(73) Assignee: FUJI ELECTRIC CO., LTD., Kawasaki-shi, Kanagawa (JP)

( * ) Notice: Subject to any disclaimer, the term of this patent is extended or adjusted under 35 U.S.C. 154(b) by 0 days.

(21) Appl. No.: 15/961,234

(22) Filed: Apr. 24, 2018

(65) Prior Publication Data

US 2019/0006527 A1 Jan. 3, 2019

(30) Foreign Application Priority Data

Jun. 30, 2017 (JP) ................................. 2017-129908

(51) Int. Cl.
*H01L 29/861* (2006.01)
*H01L 29/866* (2006.01)
(Continued)

(52) U.S. Cl.
CPC .......... *H01L 29/8611* (2013.01); *H01L 25/18* (2013.01); *H01L 29/0684* (2013.01); *H01L 29/36* (2013.01); *H01L 29/866* (2013.01); *H01L 24/05* (2013.01); *H01L 24/06* (2013.01); *H01L 24/29* (2013.01); *H01L 24/32* (2013.01); *H01L 24/33* (2013.01); *H01L 24/48* (2013.01); *H01L 24/73* (2013.01); *H01L 24/83* (2013.01);
(Continued)

(58) Field of Classification Search
CPC . H01L 29/8611; H01L 29/0684; H01L 29/36; H01L 29/866; H01L 25/18; H01L 29/861; H01L 29/0878
See application file for complete search history.

(56) References Cited

U.S. PATENT DOCUMENTS

2018/0294249 A1* 10/2018 Watanabe ........... H01L 25/0652

FOREIGN PATENT DOCUMENTS

| JP | 2712448 B2 | 2/1998 |
| JP | 2009-027050 A | 2/2009 |
| JP | 4547977 B2 | 9/2010 |

* cited by examiner

*Primary Examiner* — Patricia D Reddington
(74) *Attorney, Agent, or Firm* — Rabin & Berdo, P.C.

(57) ABSTRACT

A $p^+$-type anode region that forms a contact of an anode electrode on a front surface of a semiconductor substrate and a $p^+$-type starting substrate of a rear surface of the semiconductor substrate is formed on the front surface of the semiconductor substrate, whereby an up-anode type vertical diode is configured. The semiconductor substrate has a $p^-$-type epitaxial layer stacked on the $p^+$-type starting substrate, and a p-type transition layer in a surface layer of the $p^-$-type epitaxial layer, facing the $p^+$-type starting substrate. A p-type anode diffusion region is provided between a $p^+$-type surface anode region and the p-type transition layer, and contacts the $p^+$-type surface anode region and the p-type transition layer. A p-type impurity concentration of the p-type anode diffusion region decreases from an interface with the $p^+$-type surface anode region toward an interface with the p-type transition layer.

10 Claims, 9 Drawing Sheets

(51) Int. Cl.
  *H01L 25/18*    (2006.01)
  *H01L 29/06*    (2006.01)
  *H01L 29/36*    (2006.01)
  *H01L 23/00*    (2006.01)
  *H01L 29/08*    (2006.01)

(52) U.S. Cl.
  CPC ........ *H01L 29/0878* (2013.01); *H01L 29/861* (2013.01); *H01L 2224/04026* (2013.01); *H01L 2224/04042* (2013.01); *H01L 2224/05551* (2013.01); *H01L 2224/05553* (2013.01); *H01L 2224/05567* (2013.01); *H01L 2224/0603* (2013.01); *H01L 2224/06051* (2013.01); *H01L 2224/06181* (2013.01); *H01L 2224/291* (2013.01); *H01L 2224/2919* (2013.01); *H01L 2224/32145* (2013.01); *H01L 2224/32225* (2013.01); *H01L 2224/32245* (2013.01); *H01L 2224/33181* (2013.01); *H01L 2224/48091* (2013.01); *H01L 2224/48145* (2013.01); *H01L 2224/73265* (2013.01); *H01L 2224/83851* (2013.01); *H01L 2924/12035* (2013.01); *H01L 2924/12036* (2013.01); *H01L 2924/13055* (2013.01); *H01L 2924/14* (2013.01)

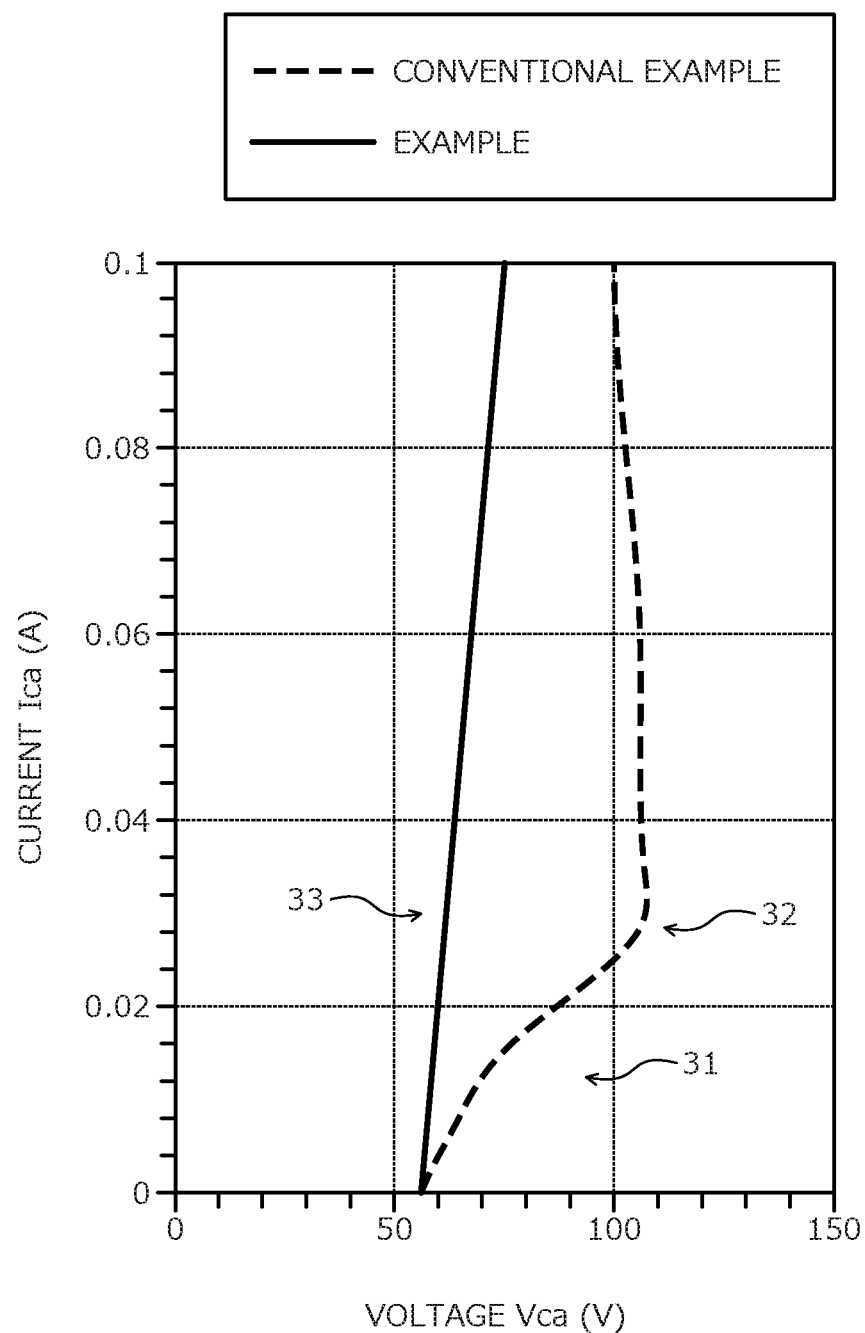

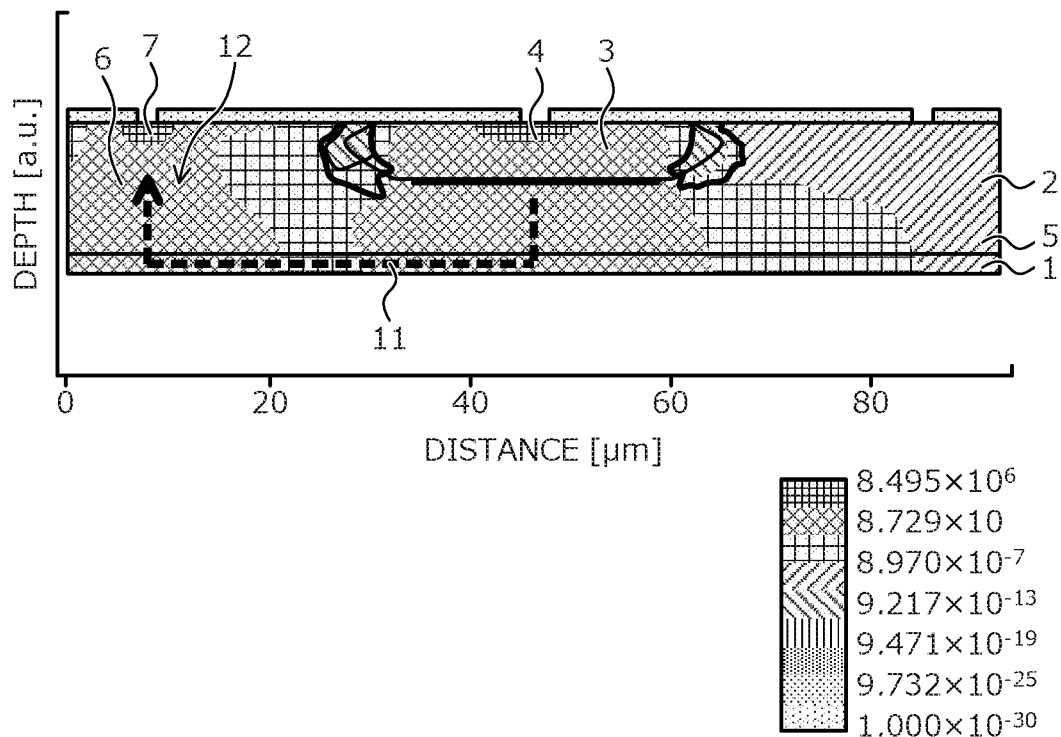
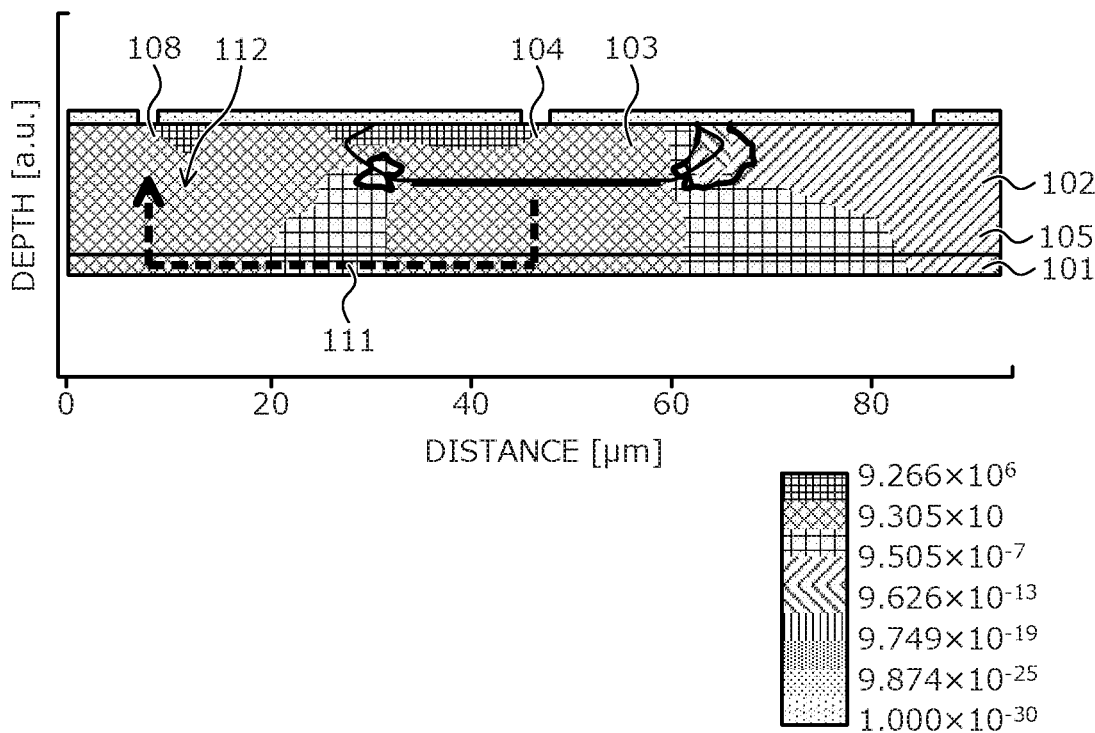

SEMICONDUCTOR DEVICE AND SEMICONDUCTOR MODULE

CROSS REFERENCE TO RELATED APPLICATIONS

This application is based upon and claims the benefit of priority of the prior Japanese Patent Application No. 2017-129908, filed on Jun. 30, 2017, the entire contents of which are incorporated herein by reference.

BACKGROUND OF THE INVENTION

1. Field of the Invention

Embodiments of the present invention relate to a semiconductor device and a semiconductor module.

2. Description of the Related Art

In conventional automotive power integrated circuits (ICs), a vertical diode is used as a protection element to protect internal circuits from voltage surges. FIG. 10 is a cross-sectional view of an example of a structure of a general vertical diode. In FIG. 10, conductivity types of a $p^+$-type starting substrate 101 and a $p^-$-type epitaxial layer 102 are indicated as "$p^+$sub" and "$p^-$epi", respectively (similarly in FIG. 11). As depicted in FIG. 10, a vertical diode has a structure in which an n-type diffusion region 103 that constitutes an n-type cathode region is formed in a $p^-$-type epitaxial layer 102 stacked on a front surface of the $p^+$-type starting substrate 101 that constitutes a $p^+$-type anode region. The vertical diode further has an $n^+$-type diffusion region 104 that is for contact (electrical contact with a metal layer) and formed in the n-type diffusion region 103.

In the vertical diode depicted in FIG. 10, generally, a metal layer that is connected to the $n^+$-type diffusion region 104 in a front surface (surface on the $p^-$-type epitaxial layer 102 side) of a semiconductor substrate 110 is a cathode electrode 106, and a metal layer that is connected to the $p^+$-type starting substrate 101 of a rear surface side (rear surface of the $p^+$-type starting substrate 101) is an anode electrode 107. The semiconductor substrate 110 is an epitaxial substrate in which the $p^-$-type epitaxial layer 102 is stacked on a front surface of the $p^+$-type starting substrate 101. In the $p^-$-type epitaxial layer 102, a p-type impurity diffuses from the $p^+$-type starting substrate 101, which has a relatively high impurity concentration. Therefore, a p-type transition layer 105 (hatched part) is formed in a surface layer of the $p^-$-type epitaxial layer 102, the surface layer facing the $p^+$-type starting substrate 101. The p-type transition layer 105 has a concentration gradient in which a p-type impurity concentration is lower with increasing depth from an interface with the $p^+$-type starting substrate 101.

On the other hand, for example, in a power IC of a chip-on-chip (CoC) type such as where an IC chip is stacked on an output stage device chip, an IC chip and a metal electrode on a front surface of the output stage device chip are electrically insulated by an insulating film attached to a rear surface of the IC chip. The entire rear surface of the IC chip is covered by the insulating film and wiring cannot be connected to the metal layer of the rear surface of the IC chip. Therefore, when the IC chip of a CoC type power IC is the vertical diode depicted in FIG. 10, the anode electrode 107 of the rear surface of the IC chip cannot be used. As a vertical diode that solves this problem, up-anode type vertical diodes have been proposed in which a $p^+$-type diffusion region for contact with an anode electrode and a metal layer constituting the anode electrode are formed on a front surface side of a semiconductor substrate (for example, refer to Japanese Patent No. 2712448, Japanese Patent No. 4547977, Japanese Laid-Open Patent Publication No. 2009-27050).

FIG. 11 is a cross-sectional view of an example of a structure of a conventional up-anode type vertical diode. In FIG. 11, the conductivity type of the p-type transition layer 105 is indicated as "p transition layer". FIGS. 12A and 12B are characteristic diagrams of impurity concentration gradients at cutting line AA-AA' and cutting line BB-BB' in FIG. 11, respectively. The conventional up-anode type vertical diode depicted in FIG. 11 differs from the vertical diode depicted in FIG. 10 in that a $p^+$-type diffusion region (hereinafter, $p^+$-type surface anode region) 108 is provided in the $p^-$-type epitaxial layer 102, and an anode electrode 109 connected to the $p^+$-type surface anode region 108 is provided on the front surface of the semiconductor substrate 110. The pn junctions of the $p^+$-type surface anode region 108, the $p^-$-type epitaxial layer 102 and the p-type transition layer 105 formed with the n-type diffusion region 103 and the $n^+$-type diffusion region 104 are used as a pseudo vertical diode. Wiring is connected to the cathode electrode 106 and the anode electrode 109 on the front surface of the semiconductor substrate 110.

SUMMARY OF THE INVENTION

According to an embodiment of the present invention, a semiconductor device includes a first semiconductor layer of a first conductivity type; a second semiconductor layer of the first conductivity type provided on a surface of the first semiconductor layer, an impurity concentration of the second semiconductor layer being lower than an impurity concentration of the first semiconductor layer; a first semiconductor region of the first conductivity type provided in a first surface of the second semiconductor layer facing the first semiconductor layer, the first semiconductor region provided to be in contact with the first semiconductor layer, an impurity concentration of the first semiconductor region being lower than the impurity concentration of the first semiconductor layer and higher than the impurity concentration of the second semiconductor layer; a second semiconductor region of a second conductivity type selectively provided at a depth reaching the first semiconductor region from a second surface of the second semiconductor layer opposite the first surface of the second semiconductor layer; a third semiconductor region of the second conductivity type selectively provided in the second semiconductor region, an impurity concentration of the third semiconductor region being higher than an impurity concentration of the second semiconductor region; a fourth semiconductor region of the first conductivity type selectively provided at a depth reaching the first semiconductor region from the second surface of the second semiconductor layer, the fourth semiconductor region being provided separately from the second semiconductor region, an impurity concentration of the fourth semiconductor region being higher than the impurity concentration of the second semiconductor layer; a fifth semiconductor region of the first conductivity type provided in the fourth semiconductor region, the fifth semiconductor region being a surface layer of the second surface of the second semiconductor layer, an impurity concentration of the fifth semiconductor region being higher than impurity concentrations of the second semiconductor layer and the fourth semiconductor region; a first electrode provided on the surface of the second surface of the second semiconductor layer, the first electrode being electrically connected to the third semiconductor region; and a second electrode provided on the surface of the second surface of the second semiconductor layer, the second electrode being electrically connected to the fifth semiconductor region.

In the embodiment, the fourth semiconductor region is provided separately from the first semiconductor layer.

In the embodiment, the fourth semiconductor region has a p-type impurity concentration gradient in which a p-type impurity concentration decreases from an interface with the fifth semiconductor region toward an interface with the first semiconductor region.

In the embodiment, the first semiconductor region has a p-type impurity concentration gradient in which a p-type impurity concentration decreases from an interface with the first semiconductor layer toward an interface with the fourth semiconductor region.

In the embodiment, the first semiconductor region has a p-type impurity concentration gradient in which a p-type impurity concentration decreases stepwise from an interface with the first semiconductor layer toward an interface with the fourth semiconductor region.

In the embodiment, the first semiconductor region is a diffusion region formed by diffusion of an impurity of the second conductivity type, from the first semiconductor layer to the second semiconductor layer.

According to another embodiment of the present invention, a semiconductor module includes a first semiconductor chip on which a semiconductor device is formed and on a surface of a first semiconductor layer, a second semiconductor layer is stacked. The semiconductor device includes the first semiconductor layer of a first conductivity type; the second semiconductor layer of the first conductivity type provided on a surface of the first semiconductor layer, an impurity concentration of the second semiconductor layer being lower than an impurity concentration of the first semiconductor layer; a first semiconductor region of the first conductivity type provided in a first surface of the second semiconductor layer facing the first semiconductor layer, the first semiconductor region provided to be in contact with the first semiconductor layer, an impurity concentration of the first semiconductor region being lower than the impurity concentration of the first semiconductor layer and higher than the impurity concentration of the second semiconductor layer; a second semiconductor region of a second conductivity type selectively provided at a depth reaching the first semiconductor region from a surface of a second surface of the second semiconductor layer opposite the first surface of the second semiconductor layer; a third semiconductor region of the second conductivity type selectively provided in the second semiconductor region, an impurity concentration of the third semiconductor region being higher than an impurity concentration of the second semiconductor region; a fourth semiconductor region of the first conductivity type selectively provided at a depth reaching the first semiconductor region from the second surface of the second semiconductor layer, the fourth semiconductor region being provided separately from the second semiconductor region, an impurity concentration of the fourth semiconductor region being higher than the impurity concentration of the second semiconductor layer; a fifth semiconductor region of the first conductivity type provided in the fourth semiconductor region, the fifth semiconductor region being a surface layer of the second surface of the second semiconductor layer, an impurity concentration of the fifth semiconductor region being higher than impurity concentrations of the second semiconductor layer and the fourth semiconductor region; a first electrode provided on the surface of the second surface of the second semiconductor layer, the first electrode being electrically connected to the third semiconductor region; and a second electrode provided on the surface of the second surface of the second semiconductor layer, the second electrode being electrically connected to the fifth semiconductor region. The semiconductor module further includes a second semiconductor chip on which a surface of the first semiconductor chip is fixed to a front surface of the second semiconductor chip, via an insulating film, the surface of the first semiconductor chip being on a rear side of the first semiconductor layer.

In the embodiment, a chip size of the first semiconductor chip is smaller than a chip size of the second semiconductor chip.

In the embodiment, the semiconductor module further includes an electrode layer provided on the front surface of the second semiconductor chip. The surface of the first semiconductor chip on the rear side of the first semiconductor layer is disposed on a surface of the electrode layer, via the insulating film.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5 is a characteristic diagram of current/voltage characteristics of a semiconductor device according to an example;

FIG. 6 shows simulation results depicting current distribution of the semiconductor device according to the example;

FIG. 7 shows simulation results depicting current distribution of a semiconductor device of a conventional example;

DETAILED DESCRIPTION OF THE INVENTION

Figure 10:
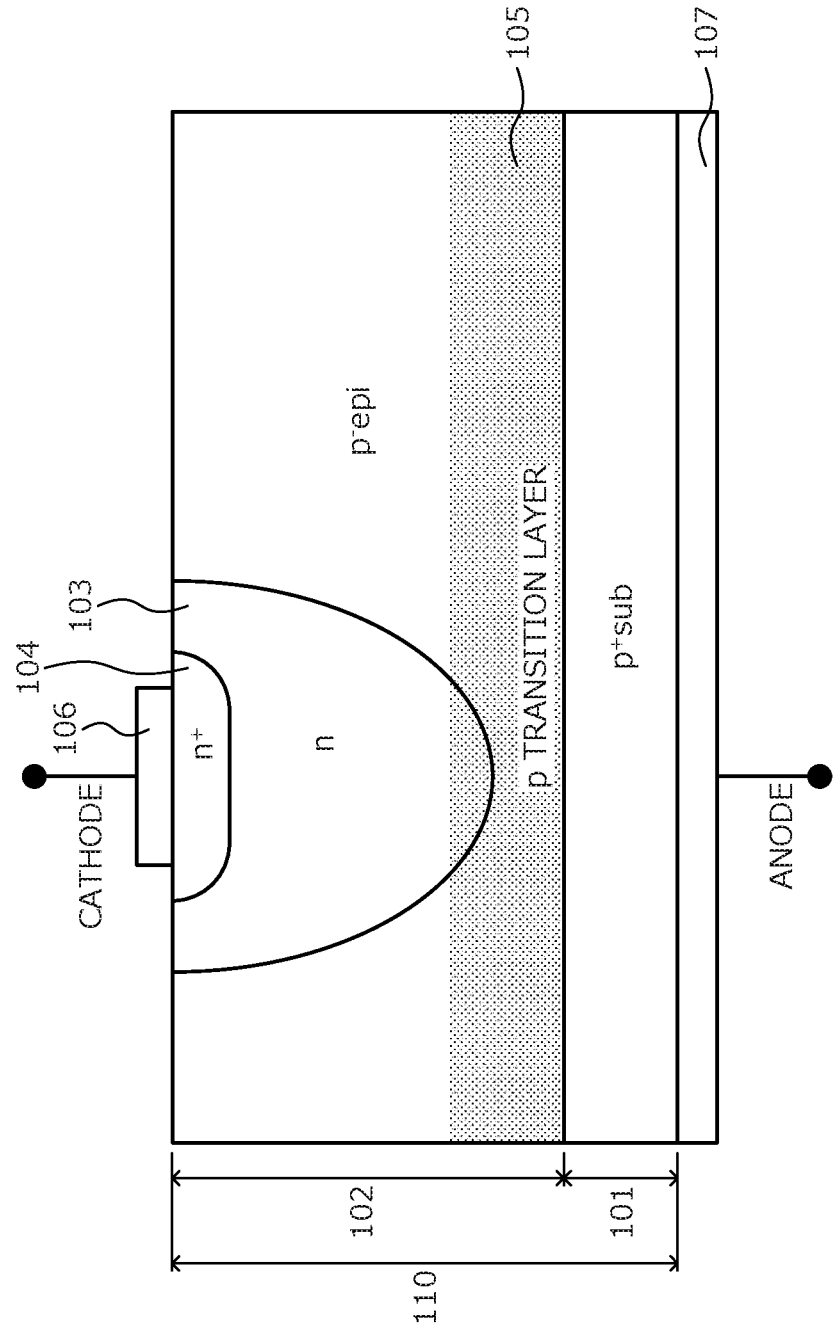
FIG. 10 is a cross-sectional view of an example of a structure of a general vertical diode.
Figure 11:
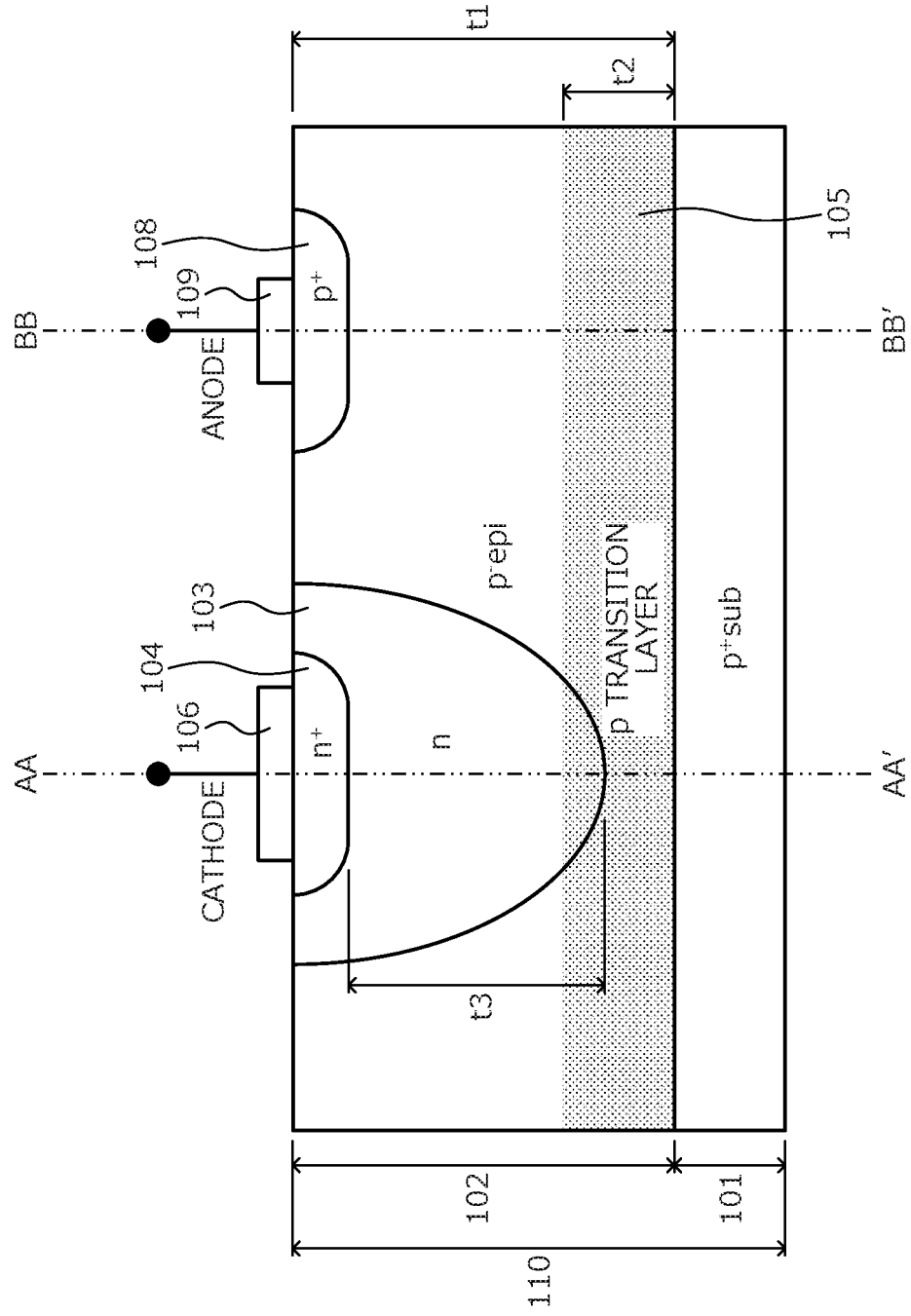
FIG. 11 is a cross-sectional view of an example of a structure of a conventional up-anode type vertical diode.

First problems related to the conventional techniques will be discussed. In the conventional vertical diode (refer to FIGS. 10 and 11), the p-type transition layer 105 and the n-type diffusion region 103 formed by an n-type impurity diffusing from the front surface of the semiconductor substrate 110 are in contact with each other, forming a pn junction. An impurity concentration of the p-type transition layer 105 is higher than an impurity concentration of the p⁻-type epitaxial layer 102 and thus, breakdown voltage (withstand voltage) of the pn junction between the p-type transition layer 105 and the n-type diffusion region 103 is lower than breakdown voltage of a pn junction between the p⁻-type epitaxial layer 102 and the n-type diffusion region 103. Therefore, avalanche breakdown occurs at a bottom (part toward the p-type transition layer 105) of the n-type diffusion region 103 rather than near a surface region of the n-type diffusion region 103 (near the front surface of the semiconductor substrate 110).

Furthermore, in a case of the conventional up-anode type vertical diode (refer to FIG. 11), current (hereinafter, avalanche current) generated by avalanche breakdown at the bottom of the n-type diffusion region 103 flows in the p⁺-type starting substrate 101 and flows from the p⁺-type surface anode region 108 at the substrate front surface (the front surface of the semiconductor substrate 110) side to the anode electrode 109, via the p⁻-type epitaxial layer 102. In this manner, a current path 111 of the avalanche current (refer to FIG. 7) includes the p⁻-type epitaxial layer 102, which has a high resistance (part indicated by reference numeral 112 in FIG. 7), whereby the following two problems arise.

Firstly, operation resistance of the vertical diode increases after avalanche breakdown and therefore, when a vertical diode is used as a protection element, the breakdown voltage capability (breakdown tolerance) of the protected element is reached by a comparatively small current. Secondly, as the avalanche current increases, a high electric field region 113 (refer to FIG. 9) occurs at an interface of the p⁻-type epitaxial layer 102 and the p⁺-type surface anode region 108, and negative resistance occurs due to effects of the high electric field region 113. Current concentrates locally due to the occurrence of the negative resistance, whereby the vertical diode is easily destroyed.

Embodiments of a semiconductor device and a semiconductor module according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
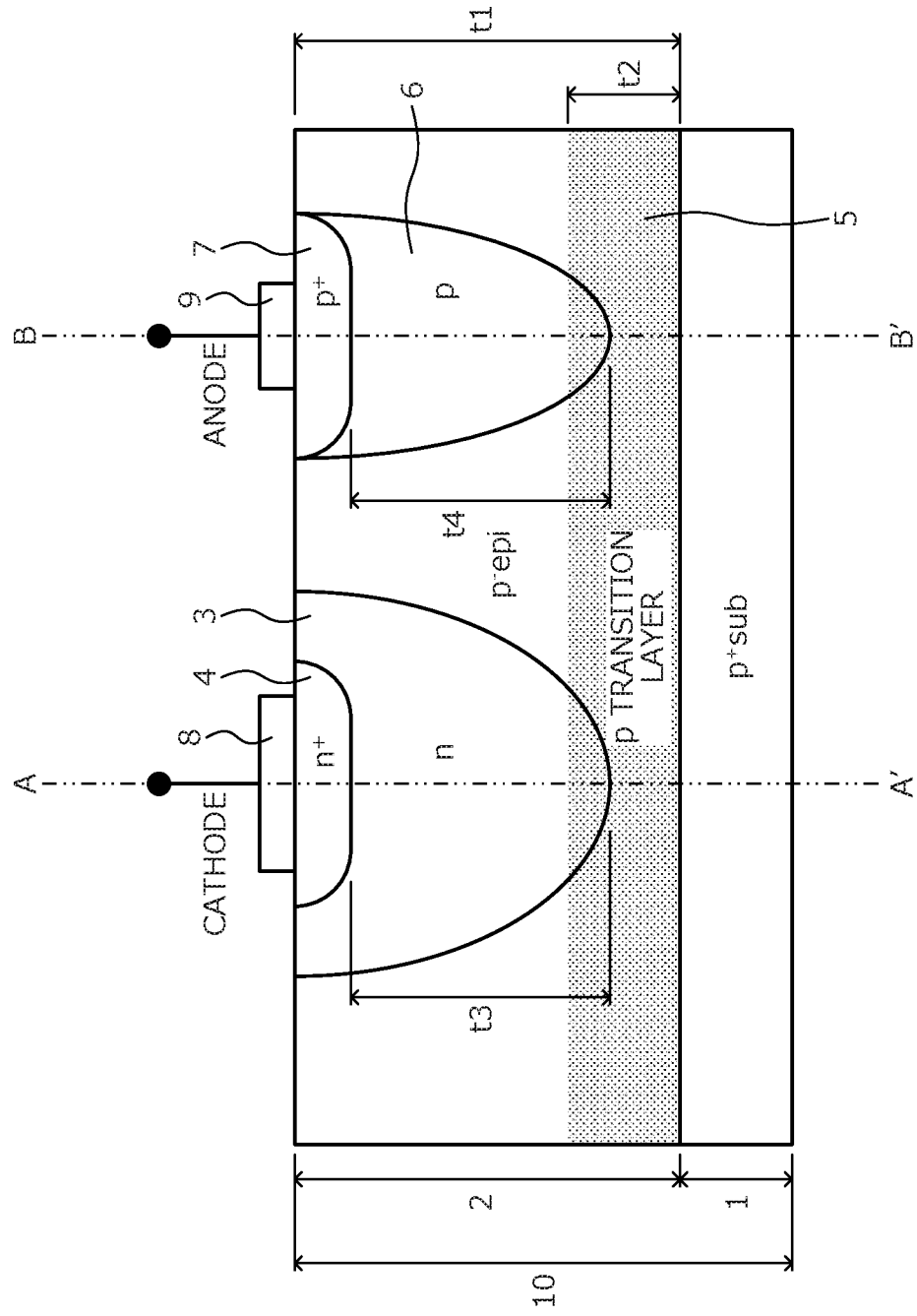
FIG. 1 is a cross-sectional view of a structure of a semiconductor device according to an embodiment.
Figure 2A:
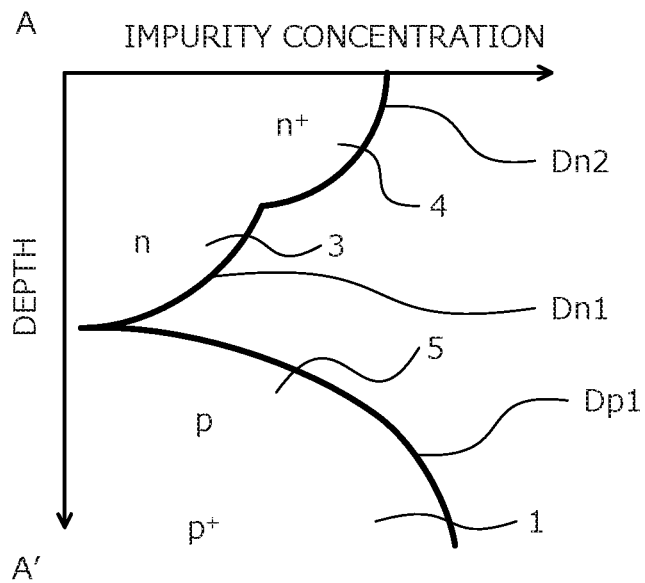
FIG. 2A is a characteristic diagram of impurity concentration gradients at cutting line A-A' in FIG. 1.
Figure 2B:
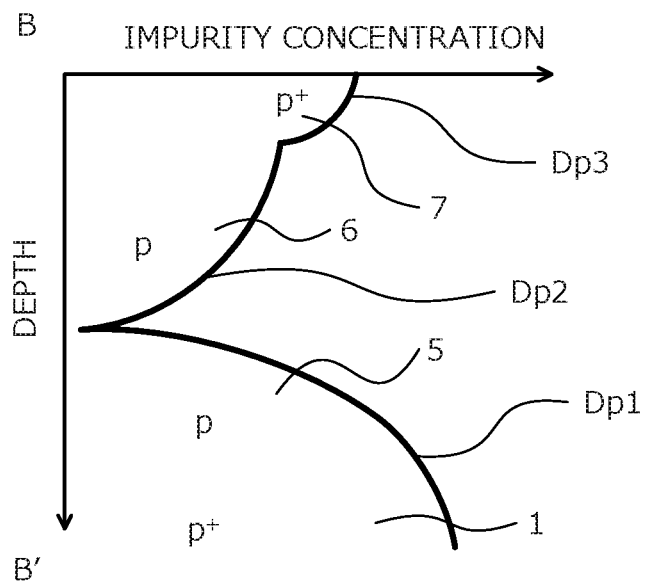
FIG. 2B is a characteristic diagram of impurity concentration gradients at cutting line B-B' in FIG. 1.

A structure of the semiconductor device according to an embodiment will be described. FIG. 1 is a cross-sectional view of a structure of the semiconductor device according to the embodiment. In FIG. 1, conductivity types of a p⁺-type starting substrate (first semiconductor layer) 1, a p⁻-type epitaxial layer (second semiconductor layer) 2, and a p-type transition layer (first semiconductor region) 5 are indicated as "p⁺sub", "p⁻epi", and "p transition layer", respectively, and the p-type transition layer 5 is indicated by hatching. FIGS. 2A and 2B are characteristic diagrams of impurity concentration gradients at cutting line A-A' and cutting line B-B' in FIG. 1, respectively. An impurity concentration gradient is impurity concentration distribution occurring due to diffusion of an impurity introduced in a semiconductor substrate (semiconductor chip) 10.

The semiconductor device according to the embodiment depicted in FIG. 1 has a cathode electrode (first electrode) 8 and an anode electrode (second electrode) 9 on a front surface of the semiconductor substrate 10. The semiconductor device further has on the front surface side of the semiconductor substrate 10, a p⁺-type diffusion region (p⁺-type surface anode region (fifth semiconductor region)) 7 for forming a contact (electrical contact) of the anode electrode 9 and a p⁺-type anode region of a rear surface side of the semiconductor substrate 10 and thus, is an up-anode type vertical diode configured by a pseudo vertical diode. Wiring connections to each of the cathode electrode 8 and the anode electrode 9 are possible at the front surface of the semiconductor substrate 10.

In particular, the semiconductor substrate 10 is an epitaxial substrate in which the p⁻-type epitaxial layer 2 is formed by epitaxial growth on a front surface of the p⁺-type starting substrate 1 constituting the p⁺-type anode region. An impurity concentration of the p⁺-type starting substrate 1 is, for example, about $1\times10^{18}/cm^3$ to $9\times10^{20}/cm^3$. An impurity concentration of the p⁻-type epitaxial layer 2 is, for example, about $1\times10^{14}/cm^3$ to $9\times10^{16}/cm^3$. A thickness t1 of the p⁻-type epitaxial layer 2 is, for example, about 5 μm to 15 μm. Resistivity of the p⁺-type starting substrate 1 is uniform along a thickness direction, where being uniform means deviation of the resistivity along the thickness direction of the p⁺-type starting substrate 1 is within ±20%. Further, resistivity of a part of the p⁻-type epitaxial layer 2 other than the p-type transition layer 5, which is described hereinafter, is uniform in a thickness direction similarly to the p⁺-type starting substrate 1.

The p-type transition layer 5 is formed in a surface layer of the p⁻-type epitaxial layer 2, on a side of the p⁻-type epitaxial layer 2 facing the p⁺-type starting substrate 1. The p-type transition layer 5 is formed by a diffusion of a p-type impurity that is included in the p⁺-type starting substrate 1, which has a relatively high impurity concentration, the p-type impurity diffusing to the p⁻-type epitaxial layer 2 at the time of fabrication of the semiconductor substrate 10. The p-type transition layer 5 has a p-type impurity concentration gradient Dp1 in which a p-type impurity concentration is lower with increasing depth from an interface with the p⁺-type starting substrate 1, toward the front surface side of the semiconductor substrate 10.

In particular, a thickness t2 of the p-type transition layer 5 is, for example, about 2 μm to 10 μm. A highest impurity concentration of the p-type transition layer 5 is at the interface with the p⁺-type starting substrate 1 and is about a same as the impurity concentration of the p⁺-type starting substrate 1. Further, the p-type transition layer 5 has a lowest impurity concentration at an interface with a part of the p⁻-type epitaxial layer 2, the part being on the front surface side of the semiconductor substrate 10 and remaining at the original p-type impurity concentration due to the p-type impurity included in the p⁺-type starting substrate 1 not diffusing into the part (hereinafter, remaining part of the p⁻-type epitaxial layer 2 on the substrate front surface side). Further, at cutting line B-B' in FIG. 1, a lowest impurity concentration of the p-type transition layer 5 is at an interface with a p-type anode diffusion region (fourth semiconductor region) 6 described hereinafter. The lowest impurity concentration of the p-type transition layer 5 is, for example, about $1\times10^{16}/cm^3$ to $9\times10^{16}/cm^3$, and at minimum is about the impurity concentration of the p⁻-type epitaxial layer 2.

In other words, the p-type transition layer 5 has for a thickness t2 thereof, from the interface with the p$^+$-type starting substrate 1 to the interface with the remaining part of the p$^-$-type epitaxial layer 2 on the substrate front surface side, the p-type impurity concentration gradient Dp1 that decreases following a parabolic curve based on Gaussian distribution, from a highest impurity concentration to a lowest impurity concentration. Due to the p$^+$-type starting substrate 1 and the p-type transition layer 5, a p-type impurity concentration gradient is formed in which the p-type impurity concentration is lower with increasing distance from the rear surface of the semiconductor substrate 10, following a parabolic curve continuous from the rear surface of the semiconductor substrate 10 (the rear surface of the p$^+$-type starting substrate 1) to an interface of the p-type transition layer 5 and an n-type diffusion region 3 described hereinafter.

In this manner, at the interface of the p$^-$-type epitaxial layer 2 with the p$^+$-type starting substrate 1, the p-type transition layer 5 having the described p-type impurity concentration gradient Dp1 is provided, whereby the p-type impurity concentration may be lowered with increasing depth from the rear surface of the semiconductor substrate 10. In other words, at the interface of the p$^+$-type starting substrate 1 and the p$^-$-type epitaxial layer 2, a sharp decrease in the p-type impurity concentration is prevented. As a result, problems (element destruction, occurrence of negative resistance) caused by current (avalanche current) generated by avalanche breakdown may be suppressed.

In a surface layer of the front surface (surface on the p$^-$-type epitaxial layer 2 side) of the semiconductor substrate 10, the n-type diffusion region (second semiconductor region) 3 constituting an n-type cathode region is selectively provided in the p$^-$-type epitaxial layer 2. The n-type diffusion region 3 reaches the p-type transition layer 5 from the front surface of the semiconductor substrate 10, and is provided at a depth not reaching the p$^+$-type starting substrate 1. A depth t3 of the n-type diffusion region 3 from an edge of an n$^+$-type diffusion region 4 described hereinafter is, for example, about 3 μm to 10 μm, the edge of the n$^+$-type diffusion region 4 facing toward the p-type transition layer 5. Further, in the surface layer on the front surface of the semiconductor substrate 10, the n$^+$-type diffusion region (third semiconductor region) 4 for forming a contact with the cathode electrode 8 is selectively provided in the n-type diffusion region 3. A depth of the n$^+$-type diffusion region 4 is at most 1 μm.

At cutting line A-A' in FIG. 1, the n-type diffusion region 3 has an n-type impurity concentration gradient Dn1 that indicates a highest value at an interface with the n$^+$-type diffusion region 4 and the n-type impurity concentration becoming lower from the interface with the n$^+$-type diffusion region 4, toward an interface with the p-type transition layer 5. The n$^+$-type diffusion region 4 has an n-type impurity concentration gradient Dn2 that indicates a highest value at the front surface of the semiconductor substrate 10 and the n-type impurity concentration decreasing from the front surface of the semiconductor substrate 10 toward the interface with the n-type diffusion region 3. In particular, an impurity concentration of the n-type diffusion region 3 at the interface with the n$^+$-type diffusion region 4 is, for example, about $1\times10^{18}$/cm$^3$ to $1\times10^{20}$/cm$^3$. Further, an impurity concentration of the n-type diffusion region 3 at the interface with the p-type transition layer 5 is, for example, about $1\times10^{16}$/cm$^3$ to $9\times10^{16}$/cm$^3$. The n-type impurity concentration gradient Dn1 may be smaller than the n-type impurity concentration gradient Dn2.

The impurity concentration of the n$^+$-type diffusion region 4 is higher than the impurity concentration of the n-type diffusion region 3. Due to the n$^+$-type diffusion region 4 and the n-type diffusion region 3, an n-type impurity concentration gradient is formed that includes the n-type impurity concentration gradient Dn2 of the n$^+$-type diffusion region 4 and the n-type impurity concentration gradient Dn1 of the n-type diffusion region 3. The n-type impurity concentration gradient Dn2 is from the front surface of the semiconductor substrate 10 to the interface of the n-type diffusion region 3 and the p-type transition layer 5. In the n-type impurity concentration gradient Dn1 of the n-type diffusion region 3, the n-type impurity concentration decreases stepwise at the interface of the n$^+$-type diffusion region 4 and the n-type diffusion region 3.

Further, in the surface layer of the front surface of the semiconductor substrate 10, the p-type diffusion region (hereinafter, p-type anode diffusion region) 6 is selectively provided in the p$^-$-type epitaxial layer 2, separately from the n-type diffusion region 3. Further, in the surface of the front surface of the semiconductor substrate 10, a p$^+$-type surface anode region 7 is selectively provided. The p-type anode diffusion region 6 and the p$^+$-type surface anode region 7 are provided so as to be in contact with each other.

The p-type anode diffusion region 6 reaches the p-type transition layer 5 from the front surface of the semiconductor substrate 10 and is provided at a depth not reaching the p$^+$-type starting substrate 1. In other words, a part of the p-type transition layer 5 is between the p-type anode diffusion region 6 and the p$^+$-type starting substrate 1; and the p-type anode diffusion region 6 and the p$^+$-type starting substrate 1 are electrically connected via the p-type transition layer 5. A depth t4 of the p-type anode diffusion region 6, from an edge of the p$^+$-type surface anode region 7 may be, for example, about 3 μm to 10 μm, the edge of the p$^+$-type surface anode region 7 facing toward the p-type transition layer 5.

A highest impurity concentration of the p-type anode diffusion region 6 is at an interface with the p$^+$-type surface anode region 7. The highest impurity concentration is rate limited by, for example, an impurity concentration of the p$^+$-type surface anode region 7 that is formed by a diffusion of a p-type impurity introduced (for example, ion implanted) from the front surface of the semiconductor substrate 10. In particular, an impurity concentration of the p-type anode diffusion region 6 is, for example, about $1\times10^{19}$/cm$^3$ to $1\times10^{20}$/cm$^3$ at the interface with the p$^+$-type surface anode region 7. Further, the impurity concentration of the p-type anode diffusion region 6 is, for example, about $1\times10^{16}$/cm$^3$ to $9\times10^{16}$/cm$^3$ at the interface with the p-type transition layer 5. A depth of the p$^+$-type surface anode region 7 is at most 1 μm.

At cutting line B-B' in FIG. 1, the p-type anode diffusion region 6 has a p-type impurity concentration gradient Dp2 in which the p-type impurity concentration decreases from the interface with the p$^+$-type surface anode region 7, toward the interface with the p-type transition layer 5. In other words, the p-type anode diffusion region 6 has, from the interface with the p$^+$-type surface anode region 7 to the interface with the p-type transition layer 5, the p-type impurity concentration gradient Dp2 that decreases from a highest impurity concentration to a lowest impurity concentration. The p-type anode diffusion region 6 has the p-type impurity concentration gradient Dp2 and therefore, has the following effects.

Figure 12A:
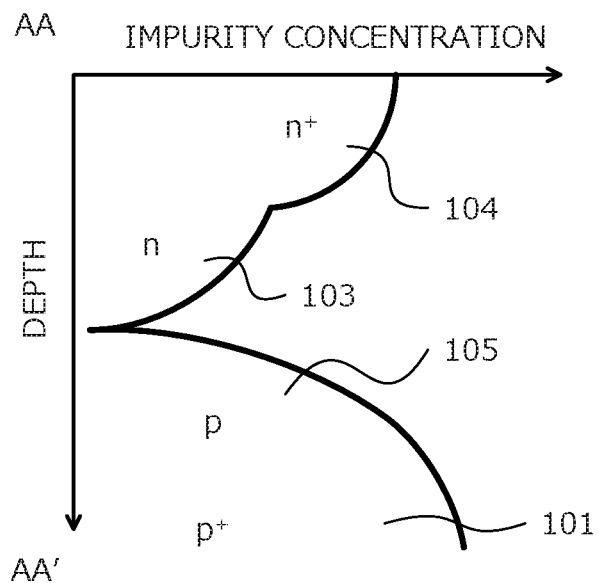
FIG. 12A is a characteristic diagram of impurity concentration gradients at cutting line AA-AA' in FIG. 11.
Figure 12B:
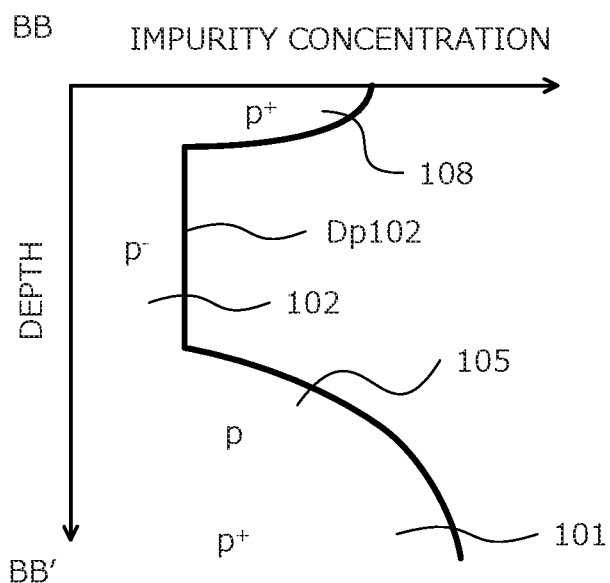
FIG. 12B is a characteristic diagram of impurity concentration gradients at cutting line BB-BB' in FIG. 11.

For example, in the up-anode type conventional vertical diode (refer to FIGS. 11, 12A, and 12B), a p$^-$-type epitaxial layer 102 is present between the p$^+$-type surface anode region 108 and the p-type transition layer 105, the p⁻-type epitaxial layer 102 having a p-type impurity concentration gradient Dp102 in which the p-type impurity concentration is constant in the depth direction. Therefore, in the current path 111 (refer to FIG. 7) of the current (avalanche current) generated at the time of avalanche breakdown, a part where the p-type impurity concentration decreases sharply is present at the boundary of the p⁻-type epitaxial layer 102 and the p⁺-type surface anode region 108 and at the boundary of the p⁻-type epitaxial layer 102 and the p-type transition layer 105. In other words, inclusion of the p⁻-type epitaxial layer 102 in the current path 111 of the avalanche current is a factor causing an occurrence of negative resistance at the time of avalanche breakdown. In contrast, in the present invention, the p-type anode diffusion region 6 having a concentration gradient in which the impurity concentration is higher than that of the p⁻-type epitaxial layer 2 is arranged in a current path 11 (refer to FIG. 6) of avalanche current, whereby the occurrence of negative resistance at the time of avalanche breakdown is suppressed. The p-type impurity concentration gradient Dp2 may be smaller than a p-type impurity concentration gradient Dp3.

The p⁺-type surface anode region 7 has the p-type impurity concentration gradient Dp3 that indicates a highest value at the front surface of the semiconductor substrate 10 and the p-type impurity concentration becoming lower from the front surface of the semiconductor substrate 10 toward the interface with the p-type anode diffusion region 6. An impurity concentration of the p⁺-type surface anode region 7 is higher than an impurity concentration of the p-type anode diffusion region 6. Due to the p⁺-type surface anode region 7 and the p-type anode diffusion region 6, a p-type impurity concentration gradient is formed that includes the p-type impurity concentration gradient Dp3 of the p⁺-type surface anode region 7 and the p-type impurity concentration gradient Dp2 of the p-type anode diffusion region 6. The p-type impurity concentration gradient Dp3 is from the front surface of the semiconductor substrate 10 to the interface of the p-type anode diffusion region 6 and the p-type transition layer 5. In the p-type impurity concentration gradient Dp2, the p-type impurity concentration decreases stepwise at the interface of the p⁺-type surface anode region 7 and the p-type anode diffusion region 6.

The pn junctions of the p⁺-type surface anode region 7, the p-type anode diffusion region 6 and the p-type transition layer 5 formed with the n-type diffusion region 3 and the n⁺-type diffusion region 4 are used as a pseudo vertical diode. The cathode electrode 8 and the anode electrode 9 are provided on the front surface of the semiconductor substrate 10. The cathode electrode 8 is electrically connected to the n⁺-type diffusion region 4. The anode electrode 9 is electrically connected to the p⁺-type surface anode region 7. Further, when the semiconductor device according to the embodiment is used as a protection element of an output stage device as described hereinafter, the cathode electrode 8 is connected to a power supply line of a main power supply potential, between a main power supply terminal and a power supply terminal of an output stage device that is to be protected. The anode electrode 9 is connected to a ground line of a ground potential.

The method of manufacturing the semiconductor device according to the embodiment will be described with reference to FIGS. 1, 2A, and 2B. First, on a front surface of the p⁺-type starting substrate 1 constituting the p⁺-type anode region, the p⁻-type epitaxial layer 2 is formed by epitaxial growth, whereby the semiconductor substrate (semiconductor wafer) 10 is fabricated. Next, by heat treatment, the semiconductor substrate 10 is heated, diffusing the p-type impurity included in the p⁺-type starting substrate 1 to the p⁻-type epitaxial layer 2, whereby the p-type transition layer 5 is formed in the surface layer of the p⁻-type epitaxial layer 2, on the side facing the p⁺-type starting substrate 1. The p-type transition layer 5 has the p-type impurity concentration gradient Dp1.

The p-type transition layer 5 may be formed by, for example, a general heat treatment process performed in a complementary metal oxide semiconductor (CMOS) process to heat the entire semiconductor substrate 10. The heat treatment for forming the p-type transition layer 5 may be, for example, heat treatment performed in a furnace having a nitrogen (N₂) atmosphere at a temperature of 1150 degrees C. for about 3 to 20 hours. The heat treatment for forming the p-type transition layer 5 may be performed concurrently with other heat treatment in a manufacturing process. Further, the p-type transition layer 5 may be formed by thermal history at the time of an assembly process of the semiconductor module.

Further, in place of the diffusion of the p-type impurity from the p⁺-type starting substrate 1 to the p⁻-type epitaxial layer 2 by heat treatment, the p-type impurity concentration gradient Dp1 of the p-type transition layer 5 may be obtained by multistage (multiple sessions of) ion implantation of differing ranges and dose amounts. In particular, for example, after ion implanting the p-type impurity from the rear surface of the semiconductor substrate 10 (rear surface of the p⁺-type starting substrate 1) with the dose amount being lower the deeper the range is set, heat treatment for diffusing the p-type impurity is performed. By the multistage ion implantation and heat treatment, an impurity concentration gradient in which the impurity concentration decreases stepwise from the interface with the p⁺-type starting substrate 1 toward the front surface of the semiconductor substrate 10 is formed in the surface layer of the p⁻-type epitaxial layer 2, on the side facing the p⁺-type starting substrate 1; and the part where this impurity concentration gradient is formed is the p-type transition layer 5.

Further, in place of the diffusion of the p-type impurity from the p⁺-type starting substrate 1 to the p⁻-type epitaxial layer 2 by heat treatment, the p-type impurity concentration gradient Dp1 of the p-type transition layer 5 may be obtained by stacking multiple p⁻-type epitaxial layers of differing impurity concentrations. In particular, for example, on the front surface of the p⁺-type starting substrate 1, multiple p⁻-type epitaxial layers are formed by epitaxial growth so that the impurity concentration of a subsequent p⁻-type epitaxial layer is lower than the impurity concentration of the p⁻-type epitaxial layer below. Due to the multiple p⁻-type epitaxial layers, an impurity concentration gradient in which the impurity concentration decreases stepwise from the interface with the p⁺-type starting substrate 1 toward the front surface of the semiconductor substrate 10 is formed in the surface layer of the p⁻-type epitaxial layer 2, on the side facing the p⁺-type starting substrate 1; and the part where this impurity concentration gradient is formed is the p-type transition layer 5.

Next, for example, by a CMOS process, multiple sessions of ion implantation and heat treatment are sequentially performed under differing conditions, whereby the n-type diffusion region 3, the p-type anode diffusion region 6, the n⁺-type diffusion region 4 and the p⁺-type surface anode region 7 are sequentially and selectively formed in the surface layer on the front surface of the semiconductor substrate 10 (surface layer of the p⁻-type epitaxial layer 2, on the opposite side of the p⁻-type epitaxial layer 2 from the side facing the p⁺-type starting substrate 1). Of these regions, for example, after the n-type diffusion region 3 and the p-type anode diffusion region 6 are sequentially and selectively formed, the n⁺-type diffusion region 4 is selectively formed in the n-type diffusion region 3 and the p⁺-type surface anode region 7 is selectively formed in the p-type anode diffusion region 6.

The n-type diffusion region 3 is formed in the front surface of the semiconductor substrate 10 by ion implantation and heat treatment, and before the n⁺-type diffusion region 4 is formed, the n-type diffusion region 3 has a concentration gradient in which the n-type impurity concentration decreases following a parabolic curve based on Gaussian distribution, from the front surface of the semiconductor substrate 10 toward the interface with the p-type transition layer 5. Similarly, the p-type anode diffusion region 6 is formed in the front surface of the semiconductor substrate 10 by ion implantation and heat treatment, and before the p⁺-type surface anode region 7 is formed, the p-type anode diffusion region 6 has a concentration gradient in which the n-type impurity concentration decreases following a parabolic curve based on Gaussian distribution, from the front surface of the semiconductor substrate 10 toward the interface with the p-type transition layer 5.

Next, for example, by sputtering, a metal layer is stacked on the front surface of the semiconductor substrate 10. Next, the metal layer is patterned so that a part of the metal layer in contact with the n⁺-type diffusion region 4 is left to remain as the cathode electrode 8 and a part in contact with the p⁺-type surface anode region 7 is left to remain as the anode electrode 9. Thereafter, the semiconductor wafer is diced (cut) into individual chips, whereby the up-anode type vertical diode depicted in FIGS. 1, 2A, and 2B is completed.

Figure 3:
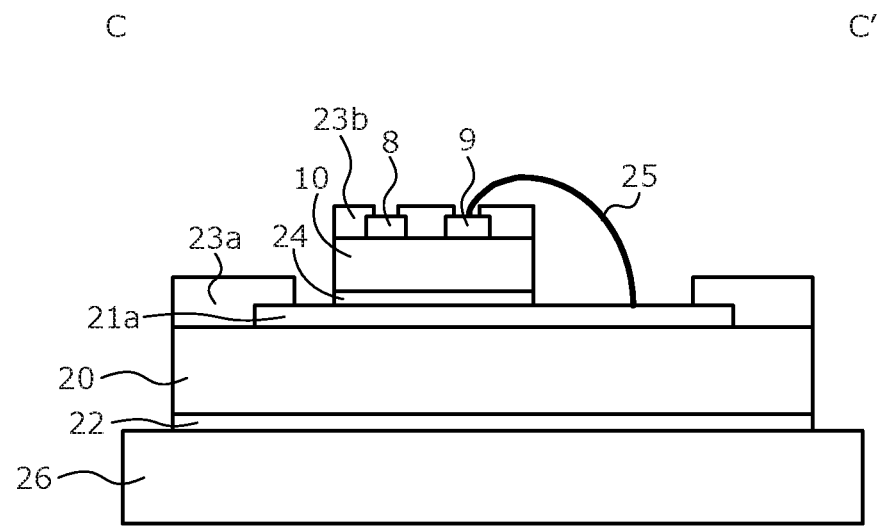
FIG. 3 is a cross-sectional view of a structure of a semiconductor module to which the semiconductor device according to the embodiment is applied.
Figure 4:
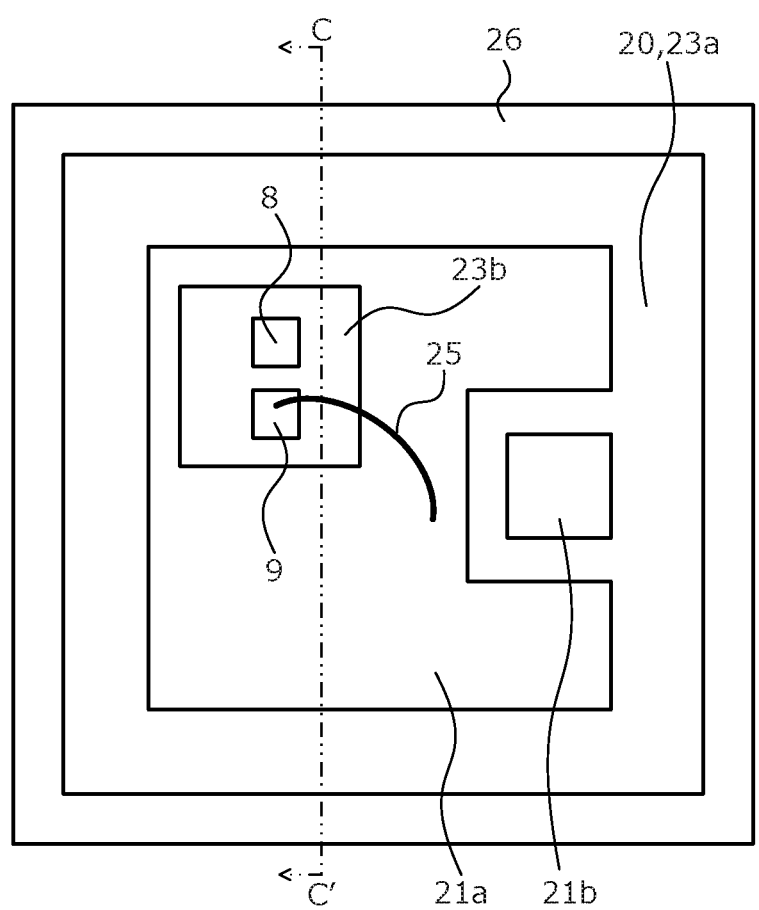
FIG. 4 is a plan view of one example of a layout of parts viewed from a front surface side of a semiconductor substrate in FIG. 3.

An example of a structure of a semiconductor module to which the semiconductor device according to the embodiment is applied will be described. FIG. 3 is a cross-sectional view of a structure of a semiconductor module to which the semiconductor device according to the embodiment is applied. In FIG. 3, cross-sectional views of regions of elements formed on the semiconductor substrate (first and second semiconductor chips) 10, 20 are omitted. FIG. 3 is a cross-sectional view at cutting line C-C' in FIG. 4. FIG. 4 is a plan view of one example of a layout of parts viewed from the front surface side of the semiconductor substrate in FIG. 3. Further, in FIG. 4, an opening of a passivation film 23 is not depicted.

The semiconductor module depicted in FIGS. 3 and 4 is a CoC type semiconductor module in which the semiconductor substrate 10 is stacked on the semiconductor substrate 20. On the semiconductor substrate 10, the up-anode type vertical diode depicted in FIGS. 1, 2A, and 2B is formed. The semiconductor substrate 10 is, for example, an IC chip used as a control element of the output stage device or a protection element for protecting the output stage device from surge voltage. Surge voltage is overvoltage (noise) such as electrostatic discharge (ESD) transiently input by the power supply line. A chip size of the semiconductor substrate 10 is, for example, smaller than a chip size of the semiconductor substrate 20.

On the semiconductor substrate 20, for example, the output stage device such as an insulated gate bipolar transistor (IGBT) is formed. The semiconductor substrate 10 is a driver IC chip of a high voltage integrated circuit (HVIC) or a low voltage integrated circuit (LVIC). A rear surface of the semiconductor substrate 20 is fixed (mounted) to an island of a lead frame 26 by solder, a conductive adhesive, or the like. The rear surface of the semiconductor substrate 20 may be fixed to a wiring pattern provided on an insulated substrate, in place of the lead frame 26.

On a front surface of the semiconductor substrate 20, a gate pad (electrode pad) 21b and an emitter electrode 21a of the IGBT are provided separated from each other. In FIG. 3, only the emitter electrode 21a of the IGBT is depicted while the gate pad 21b is not depicted. The emitter electrode 21a, for example, also functions as an emitter pad (electrode pad). Due to the emitter electrode 21a and the gate pad 21b, substantially the entire front surface of the semiconductor substrate 20 is covered by an electrode layer. A collector electrode 22 of the IGBT is provided on the rear surface of the semiconductor substrate 20 (i.e., vertical IGBT).

The collector electrode 22 on the rear surface of the semiconductor substrate 20 is fixed to the island of the lead frame 26 by solder, a conductive adhesive, or the like. On the front surface of the semiconductor substrate 20, the passivation film 23a is provided. The passivation film 23a covers a periphery of the front surface of the semiconductor substrate 20 and peripheries of the emitter electrode 21a and the gate pad 21b. In the opening of the passivation film 23a, a part of the emitter electrode 21a and a part of the gate pad 21b are exposed. The passivation film 23a may be, for example, a silicon nitride film ($Si_3N_4$ film), a polyimide film, or the like.

On the emitter electrode 21a, the rear surface of the semiconductor substrate 10 is adhered via an insulation tape 24 containing, for example, polyimide. The p⁺-type starting substrate 1 constituting the semiconductor substrate 10 is electrically insulated from the semiconductor substrate 20 and the electrode layer (the emitter electrode 21a and the gate pad 21b) of the IGBT by the insulation tape 24. The semiconductor substrate 10 may be arranged on the passivation film 23a directly or via the insulation tape 24, the passivation film 23a being provided on the front surface of the semiconductor substrate 20. The anode electrode 9 on the front surface of the semiconductor substrate 10 is electrically connected to the emitter electrode 21a of the IGBT by a wire 25.

The cathode electrode 8 and the anode electrode 9 are formed on the front surface of the semiconductor substrate 10 as described above. Therefore, wiring connections of the cathode electrode 8 and the anode electrode 9 from the front surface of the semiconductor substrate 10 are possible. The passivation film 23b is provided on the front surface of the semiconductor substrate 10. The passivation film 23b covers the periphery of the front surface of the semiconductor substrate 10 and the peripheries of the cathode electrode 8 and the anode electrode 9. The passivation film 23b may be, for example, a silicon nitride film ($Si_3N_4$ film), a polyimide film, or the like.

The layout of the parts viewed from the front surface side of the semiconductor substrates 10, 20 depicted in FIG. 4 is one example, and various modifications in the planar shape and arrangement of the cathode electrode 8, the anode electrode 9, the emitter electrode 21a, and the gate pad 21b are possible. The semiconductor substrates 10, 20, for example, are surrounded by a resin case (not depicted) adhered to a periphery of the lead frame 26, and are sealed (molded) by filling material that fills an interior of the resin case. The cathode electrode 8 and the anode electrode 9, for example, are each electrically connected to an external connection terminal (not depicted) integrally formed with the resin case, and are lead to an external device of the resin case. Alternatively, the semiconductor substrates 10, 20 may be sealed by an epoxy resin with the lead frame 26.

As described, according to the embodiment, in the p⁻-type epitaxial layer, the p-type anode diffusion region is arranged that covers the p⁺-type surface anode region and reaches the p-type transition layer. As a result, the p-type anode diffusion region, which has a lower resistance than the p⁻-type epitaxial layer, is arranged in the current path of avalanche current, whereby the resistance of the current path of the avalanche current may be reduced, enabling the operation resistance to be reduced. Further, due to an effect of the concentration gradient of the p-type anode diffusion region, a high electric field region does not occur between the p⁺-type surface anode region and the p-type anode diffusion region, enabling the occurrence of negative resistance to be prevented and the occurrence of local concentrations of current to be suppressed.

Further, according to the embodiment, the p-type transition layer is provided in the surface layer of the p⁻-type epitaxial layer, on the side of the p⁻-type epitaxial layer facing toward the p⁺-type starting substrate and therefore, the need to form the p-type anode diffusion region at a depth reaching the p⁺-type starting substrate is eliminated. The p-type anode diffusion region suffices to reach the p-type transition layer and therefore, compared to a case where the p-type transition layer is not provided, the depth of the p-type anode diffusion region may be made shallow. As a result, the heat treatment time for forming the p-type anode diffusion region may be shortened, thereby, enabling manufacturing costs to be reduced.

Further, according to the embodiment, in forming a diffusion region (p-type anode diffusion region) reaching a deep position from the surface of the semiconductor substrate, for example, formation of the trench of Japanese Laid-Open Patent Publication No. 2009-27050 as depicted in FIG. 7 is not necessary. Therefore, increases in manufacturing costs may be prevented. Further, according to the embodiment, the p⁺-type starting substrate is electrically connected to the cathode electrode via the p-type transition layer, the p-type anode diffusion region, and the p⁺-type surface anode region. As a result, no parasitic bipolar structure is formed, enabling decreases to be prevented in ESD capability due to parasitic operation.

Further, according to the embodiment, configuration as a CoC type semiconductor module in which other semiconductor chips are stacked on the semiconductor chip, enables size reductions of the semiconductor module. Further, according to the embodiment, semiconductor module of a structure in which wiring connection to the rear surface of the semiconductor substrate is not possible like a CoC type semiconductor module may be configured using a vertical diode having a higher surge current capacity as compared to a horizontal diode.

Figure 8:
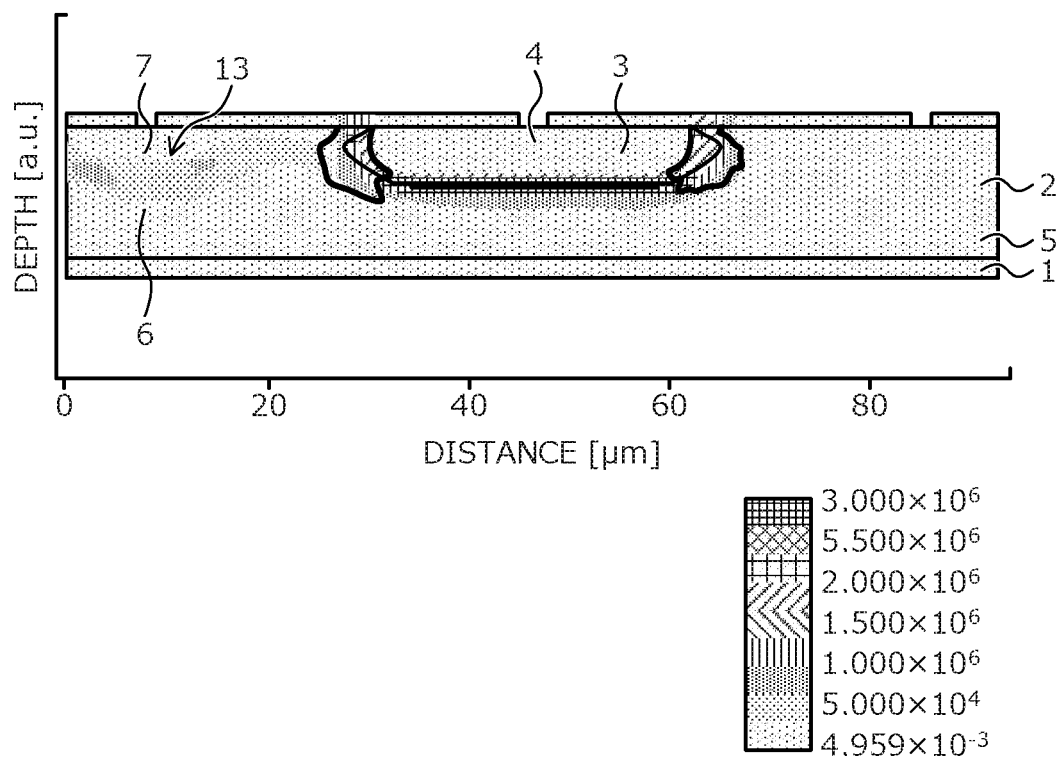
FIG. 8 shows simulation results depicting electric field distribution of the semiconductor device according to the example.
Figure 9:
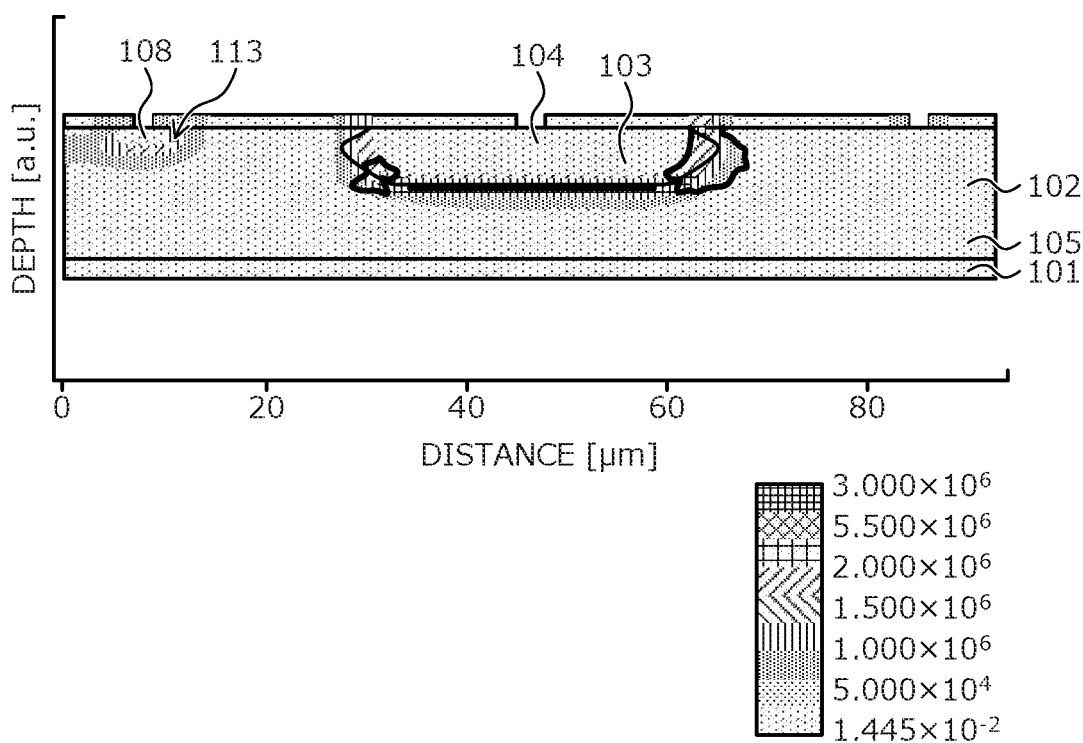
FIG. 9 shows simulation results depicting electric field distribution of an up-anode type vertical diode of the semiconductor device of the conventional example.

Operation resistance of the semiconductor device according to the embodiment was verified. Simulation was performed using a device simulator to set various types of p-type and n-type diffusion profiles in the semiconductor substrate and apply voltage between a cathode terminal and an up-anode terminal, the cathode terminal being an n-type diffusion region arranged in a central part of an upper surface of the substrate and the up-anode (anode) terminal being a p-type diffusion region arranged at an edge of the upper surface of the substrate. FIG. 5 is a characteristic diagram of current/voltage characteristics of a semiconductor device according to an example. FIG. 6 shows simulation results depicting current distribution of the semiconductor device according to the example. FIG. 7 shows simulation results depicting current distribution of a semiconductor device of a conventional example. FIG. 8 shows simulation results depicting electric field distribution of the semiconductor device according to the example. FIG. 9 shows simulation results depicting electric field distribution of an up-anode type vertical diode of the semiconductor device of the conventional example. A vertical axis in FIGS. 6 to 9 represents a depth from the front surfaces of the semiconductor substrates 10, 110 and a horizontal axis therein represents a distance in a direction parallel to the front surfaces of the semiconductor substrates 10, 110.

Results of simulation of current/voltage characteristics of the up-anode type vertical diode (hereinafter, example) having the structure (refer to FIG. 1) of the semiconductor device according to the embodiment described above are depicted in FIG. 5. FIG. 5 further depicts simulation of current/voltage characteristics of the conventional up-anode type vertical diode (refer to FIG. 11 and hereinafter, conventional example). Further, results of simulation of current distribution and electric field distribution of the example are depicted in FIGS. 6 and 8, respectively. Results of simulation of current distribution and electric field distribution of the conventional example are depicted in FIGS. 7 and 9, respectively. Here, simulation was performed with a current Ica between the cathode and the anode set as 0.1 A.

From the results depicted in FIG. 5, for the conventional example, as is commonly known for a general up-anode type vertical diode without the p-type transition layer 105, it was confirmed that the operation resistance increased (part indicated by reference numeral 31), and negative resistance occurred (part indicated by reference numeral 32). On the other hand, for the example, it was confirmed that compared to the conventional example, the operation resistance was reduced (comparison of current/voltage characteristics depicting proportional relationship indicated by reference numeral 33 of the example). Further, for the example, it was confirmed that no negative resistance occurred, and the current Ica between the cathode and the anode increased in proportion to increased voltage Vca between the cathode and the anode.

As depicted in FIG. 7, for the conventional example, at the time of avalanche breakdown, avalanche current flows in the current path 111 from the cathode (n⁺-type diffusion region 104 and the n-type diffusion region 103) and through the p⁺-type starting substrate 101, the p-type transition layer 105 and the p⁻-type epitaxial layer 102 to the p⁺-type surface anode region 108. The current path 111 of the avalanche current includes the p⁻-type epitaxial layer 102, which has a high resistance, and therefore, between the p⁺-type surface anode region 108 and the p⁺-type starting substrate 101, a part 112 is present through which a large current flows in a wider range than in the example (part indicated by reference numeral 12 in FIG. 6).

On the other hand, as depicted in FIG. 6, in the example, at the time of avalanche breakdown, avalanche current flows in the current path 11 from the cathode (n⁺-type diffusion region 4 and the n-type diffusion region 3) and through the p⁺-type starting substrate 1, the p-type transition layer 5 and the p-type anode diffusion region 6 to the p⁺-type surface anode region 7. In other words, in the current path 11 of the avalanche current, in place of the p⁻-type epitaxial layer 2, which has a high resistance, the p-type anode diffusion region 6, which has a lower resistance than the p⁻-type epitaxial layer 2, is arranged. As a result, the resistance of the current path 11 of the avalanche current may be set lower than that of the conventional example.

In the conventional example, the reason for the occurrence of the negative resistance is the occurrence of the high electric field region 113 at the interface of the p⁻-type epitaxial layer 102 and the p$^+$-type surface anode region 108 due to the influence of avalanche carriers, as depicted in FIG. 9. On the other hand, in the example, the reason for no occurrence of negative resistance is as follows. In the example, as described above, the p-type anode diffusion region 6 has a concentration gradient and therefore, as depicted in FIG. 8, in a vicinity 13 of the interface of the p$^+$-type surface anode region 7 with the p-type anode diffusion region 6, no high electric field region is generated.

The present invention is not limited to the embodiments described and various modifications within a scope not depart from the spirit of the invention are possible. For example, in the embodiments, as an example, a case has been described where a semiconductor substrate is used on which a p$^-$-type epitaxial layer is stacked on p$^+$-type starting substrate. However, without limitation hereto, in place of the p$^-$-type epitaxial layer, a p$^-$-type diffusion region formed to have a substantially uniform thickness (depth) by, for example, ion implantation from the front surface of the semiconductor substrate may be used. Further, in the embodiments above, as an example, a case has been described where a driver IC constituted by control/protection element and output stage device is a CoC type. However, an intelligent power switch (IPS), an automotive igniter, etc. may be configured as a CoC type. When an IPS is configured as a CoC type, power stages and control/protection components of the power stages are arranged on respectively different semiconductor chips, enabling costs to be reduced.

According to the embodiments of the invention, the fourth semiconductor region having a concentration gradient and a lower resistance than the resistance of the second semiconductor layer is arranged in the current path of avalanche current, whereby the resistance of the current path of the avalanche current may be reduced. Further, since no high electric field region occurs between the fourth semiconductor region and the fifth semiconductor region, a concentration of current due to negative resistance does not occur.

According to the semiconductor device and the semiconductor module of the embodiments of the invention, an effect is achieved in that a semiconductor device and a semiconductor module having a low operation resistance and that may prevent the occurrence of negative resistance may be provided.

As described, the semiconductor device and the semiconductor module according to the embodiments of the invention are useful for power semiconductor devices used in IPSs, automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a first semiconductor layer of a first conductivity type;
a second semiconductor layer of the first conductivity type having a first surface and a second surface opposite to the first surface, and being provided on the first semiconductor layer, the first surface of the second semiconductor layer facing the first semiconductor layer, the second semiconductor layer having an impurity concentration lower than an impurity concentration of the first semiconductor layer;
a first semiconductor region of the first conductivity type provided in the first surface of the second semiconductor layer, and being in contact with the first semiconductor layer, the first semiconductor region having an impurity concentration lower than the impurity concentration of the first semiconductor layer and higher than the impurity concentration of the second semiconductor layer;
a second semiconductor region of a second conductivity type, selectively provided in the second surface of the second semiconductor layer, and having a depth reaching the first semiconductor region from the second surface of the second semiconductor layer;
a third semiconductor region of the second conductivity type, selectively provided in the second semiconductor region, the third semiconductor region having an impurity concentration higher than an impurity concentration of the second semiconductor region, a bottom of the third semiconductor region is closer to the second surface of the second semiconductor layer than is a bottom of the second semiconductor region in a depth direction;
a fourth semiconductor region of the first conductivity type, selectively provided in the second surface of the second semiconductor layer, and having a depth reaching the first semiconductor region from the second surface of the second semiconductor layer, the fourth semiconductor region being provided separately from the second semiconductor region, and having an impurity concentration higher than the impurity concentration of the second semiconductor layer;
a fifth semiconductor region of the first conductivity type provided in the fourth semiconductor region, the fifth semiconductor region being disposed in the second surface of the second semiconductor layer, and having an impurity concentration higher than the impurity concentrations of the second semiconductor layer and the fourth semiconductor region, a bottom of the fifth semiconductor region is closer to the second surface of the second semiconductor layer than is a bottom of the second semiconductor region in the depth direction;
a first electrode provided on the second surface of the second semiconductor layer, and being electrically connected to the third semiconductor region; and
a second electrode provided on the second surface of the second semiconductor layer, and being electrically connected to the fifth semiconductor region.

2. The semiconductor device according to claim 1, wherein the fourth semiconductor region is provided separately from the first semiconductor layer.

3. The semiconductor device according to claim 1, wherein at least a part of the fourth semiconductor region has a p-type impurity concentration gradient in which a p-type impurity concentration decreases in a depth direction from the fifth semiconductor region toward the first semiconductor region.

4. The semiconductor device according to claim 1, wherein the first semiconductor region has a p-type impurity concentration gradient in which a p-type impurity concentration decreases in a depth direction from the first semiconductor layer toward the fourth semiconductor region.

5. The semiconductor device according to claim 1, wherein the first semiconductor region has a p-type impurity concentration gradient in which a p-type impurity concentration decreases stepwise in a depth direction from the first semiconductor layer toward the fourth semiconductor region.

6. The semiconductor device according to claim 1, wherein the first semiconductor region is a diffusion region in which an impurity of the second conductivity type of the first semiconductor layer has diffused into the second semiconductor layer.

7. A semiconductor module, comprising:
a first semiconductor chip including the semiconductor device according to claim 1, the first semiconductor chip having a rear side in which the first semiconductor layer of the first semiconductor device is disposed; and
a second semiconductor chip that is arranged on the first semiconductor chip, via an insulating film, the second semiconductor chip having a front surface that faces the rear side of the first semiconductor chip.

8. The semiconductor module according to claim 7, wherein the first semiconductor chip has a chip size smaller than a chip size of the second semiconductor chip.

9. The semiconductor module according to claim 7 and further comprising
an electrode layer provided on the front surface of the second semiconductor chip, wherein
the rear side of the first semiconductor chip is insulated from the electrode layer of the second semiconductor chip by the insulating film.

10. The semiconductor module according to claimed 1, wherein the first semiconductor region has a highest impurity concentration at a side contacting the first semiconductor layer, and the impurity concentration of the first semiconductor region in the depth direction decreases toward the second surface of the second semiconductor substrate.

* * * * *